(12) United States Patent
Perroni et al.

(10) Patent No.: US 7,366,012 B2
(45) Date of Patent: Apr. 29, 2008

(54) SYNCHRONOUS MEMORY DEVICE WITH REDUCED POWER CONSUMPTION

(75) Inventors: Maurizio Francesco Perroni, Furnari (IT); Paolino Schillaci, Casteltermini (IT); Salvatore Mazzara, Palermo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 85 days.

(21) Appl. No.: 11/138,884

(22) Filed: May 25, 2005

(65) Prior Publication Data

US 2005/0270892 A1   Dec. 8, 2005

(30) Foreign Application Priority Data

May 25, 2004  (IT)  ................. MI2004A1038

(51) Int. Cl.
  *G11C 11/34*  (2006.01)
  *G11C 7/00*  (2006.01)
  *G11C 5/14*  (2006.01)
  *G11C 8/00*  (2006.01)
(52) U.S. Cl. ................. 365/185.01; 365/196; 365/229; 365/233.1

(58) Field of Classification Search ........... 365/185.01, 365/191, 194, 233, 196, 226, 229
See application file for complete search history.

(56) References Cited

U.S. PATENT DOCUMENTS

| | | | | |
|---|---|---|---|---|
| 4,503,494 A | * | 3/1985 | Hamilton et al. | ........... 365/229 |
| 4,906,862 A | * | 3/1990 | Itano et al. | ........... 365/185.17 |
| 6,622,224 B1 | * | 9/2003 | Cloud | ........... 71/158 |
| 6,658,578 B1 | * | 12/2003 | Laurenti et al. | ........... 713/324 |
| 2004/0032759 A1 | * | 2/2004 | Chow et al. | ........... 365/145 |
| 2004/0165473 A1 | * | 8/2004 | Roohparvar | ........... 365/233 |

FOREIGN PATENT DOCUMENTS

JP        10240622 A   *   9/1998

* cited by examiner

*Primary Examiner*—Ly D Pham
(74) *Attorney, Agent, or Firm*—Lisa K. Jorgenson; E. Russell Tarleton; Seed IP Law Group PLLC

(57) ABSTRACT

A synchronous non-volatile memory device that includes a circuit for performing operations on the memory device, a circuit for receiving a request of operation and operative information required for performing the operation in temporal succession, an activation circuit for activating the circuit in response to the request of operation, a circuit for enabling the execution of the operation in response to the operative information, and a deactivation circuit for deactivating the operations performing circuit in response to the completion of the operation.

32 Claims, 3 Drawing Sheets

SYNCHRONOUS MEMORY DEVICE WITH REDUCED POWER CONSUMPTION

BACKGROUND OF THE INVENTION

1. Field of the Invention

The present invention relates to memory devices and, more particularly, to a synchronous non-volatile memory device and to a corresponding working method thereof.

2. Description of the Related Art

One of the main requirements of memory devices is reducing the power consumption as far as possible (especially for use in portable systems, such as mobile phones). The circuit blocks of a memory device that mostly affect the power consumption include, for example, voltage generators, such as charge pumps necessary to provide boosted voltages, and current generators, which provide internal current references.

To reduce power consumption, current and voltage generation circuits are switched on to perform an operation on the memory device during a phase of "activity" and are switched off during a phase of "wait" (or of "stand-by") of the same.

Considering, for example, a reading operation on asynchronous memory devices, an address (corresponding to a memory location wherein a word to be read is stored) is received from an external source. An Address Transition Detection or ATD circuit detects the reception of the address. The current and voltage generation circuits are switched on in response to the detection of the address to allow the reading of the word. Typically, the current and voltage generation circuits are maintained switched on for a predetermined period far longer than the duration of the reading operation (for example, 600 ns and 40 ns, respectively). This maintains the current and voltage generation circuits in a ready condition in case a new operation must be performed subsequently.

Generally this method of operation is also applied to synchronous memory devices, i.e., memory devices wherein each operation is synchronized with a clock. The synchronous memory devices are implemented in such way to communicate with external devices (for example, a microprocessor that needs to read the data stored in the memory device) through external communication buses.

Let us consider, for example, a synchronous memory device implemented according to a protocol that allows working with a low number of signals so as to limit the corresponding number of pins of the memory device, and therefore cost and size thereof. An example of such protocol is the Low Pin Count (LPC) protocol that provides a communication bus formed by a reduced number of signal lines for transferring address codes (to access memory locations), data (such as words to be read from or to be written onto the memory device) and command codes (to perform a read or write operation on the memory device). The communication bus further provides clock signals and signals corresponding to operation requests. A bus conforming to the standard LPC exploits a time-division multiplexing scheme that allows a transfer parallelism typically lower than that of the memories, which have a plurality of signal lines for the transfer both of the data and of the addresses depending on the sizes of the words and of the memory, respectively (in terms of number of locations).

Typically, an external microprocessor provides an operation request to the synchronous memory device conforming to the LPC protocol, which in response thereto activates the voltage and current generation circuits. Subsequently, during an initial time equal to some clock periods, the memory device receives an operation command code and an address for selecting a location. When the address has been received in full, the requested word can be read and returned to the outside. Subsequently to the completion of the operation, the voltage and current generation circuits are maintained on for a predetermined period (as in the case of the asynchronous memories) waiting for a possible new operation.

The inventors have noticed that the foregoing method of operation is not entirely satisfactory. In fact, the known solution does not exploit the characteristics of the above described synchronous memory device to its optimum performance. Thus, the necessity exists to optimize the enabling and disabling management of the voltage and current generation circuits.

BRIEF SUMMARY OF THE INVENTION

The disclosed embodiments of the present invention propose a synchronous non-volatile memory device that provides reduced power consumption without substantially impairing the performance of the memory device.

In accordance with one embodiment of the present invention, a synchronous non-volatile memory device is provided that includes a circuit for performing operations on the memory device; a circuit for receiving a request of operation and operative information required for performing the operation in temporal succession; an activation circuit for activating the operations performing circuit in response to the request of operation, and a circuit for enabling the execution of the operation in response to the operative information, wherein the memory device further includes a deactivation circuit for deactivating the operations performing circuit in response to the completion of the operation.

Advantageously, the synchronous non-volatile memory device includes a communication interface for interfacing with an external bus, having a data transfer parallelism lower than an internal data transfer parallelism of the memory device.

Preferably, the memory device deactivates the operations performing circuit with a pre-set delay from the enabling of the operation, the pre-set delay corresponding to the duration of the operation.

In another embodiment, the operation is a reading operation and the received operative information includes a reading address.

A suggested choice for implementing the memory device includes asserting a control signal for the pre-set delay in response to the reception of the reading address, the operations performing circuit being deactivated in response to the de-assertion of the control signal.

Furthermore, the reading operation can be a multiple reading operation and the memory device varies the reading address in succession. The control signal is asserted for the pre-set delay in response to each variation of the reading address before the de-assertion resulting from a preceding reading address.

Another suggested choice for implementing the memory device provides that the request of operation includes a start code, and that the operations performing circuit is activated in response to a decoding of such start code.

Furthermore, the memory device is able to detect an error in the request of operation or in the operative information and to deactivate the operations performing circuit in response to the detection of the error.

Another embodiment of the synchronous memory device proposes to latch a command signal for activating the operations performing circuit, the command signal is asserted for activating and de-asserted for deactivating the operations performing circuit.

Preferably, the operations performing circuit of the synchronous non-volatile memory device includes voltage boosting circuit blocks or generators of reference quantities.

A further aspect of the present invention includes a corresponding working method of the synchronous non-volatile memory device.

The proposed solution optimizes the activation and deactivation of the operations performing circuit, exploiting the characteristics of the synchronous memory device to its best. In particular, the solution of the disclosed embodiments of the invention uses the initial time for receiving the operative information in order to activate the operations performing circuit, so that they are ready when the operation is actually performed. Consequently, it is possible to deactivate the operations performing circuit immediately after the completion of the operation. This facilitates reducing the power consumption of the memory device to the minimum. Such result, nevertheless, is obtained without impairing the performance because it does not introduce any waiting time for the activation of the circuit means.

In accordance with another embodiment of the invention, a circuit is provided that includes a non-volatile memory, a circuit for performing operations on the memory in response to a request for operation, an activation circuit for activating the operations performing circuit in response to a request for operation, a circuit for enabling execution of the operation in response to receipt of operative information, and a circuit for deactivating the operations performance circuit in response to completion of the operation.

In accordance with another embodiment of the invention, a circuit for performing operations on a memory device is provided. The circuit includes a read-and-write circuit configured to read data from and write data to the memory device, and a control circuit coupled to the read-and-write circuit and configured to receive a request of operation and to activate the read-and-write circuit in response to the request of operation and to deactivate the read-and-write circuit when the read-and-write circuit has completed an operation in response to the request of operation, the control circuit configured to deactivate the read-and-write circuit with a pre-set delay from the activation of the read-and-write circuit.

In accordance with yet another embodiment of the invention, a method is provided that includes receiving a request of operation with respect to the memory device, activating an operation circuit to perform a requested operation on the memory device, and deactivating the operation circuit upon completion of the requested operation with a preset delay that commences from activation of the operation circuit.

BRIEF DESCRIPTION OF THE SEVERAL VIEWS OF THE DRAWINGS

Further characteristics and advantages of the present invention will be made evident from the following detailed description of a practical embodiment, given purely by way of an exemplificative and non-restrictive indication, which will be done in conjunction with the accompanying drawings, wherein.

DETAILED DESCRIPTION OF THE INVENTION

Figure 1:
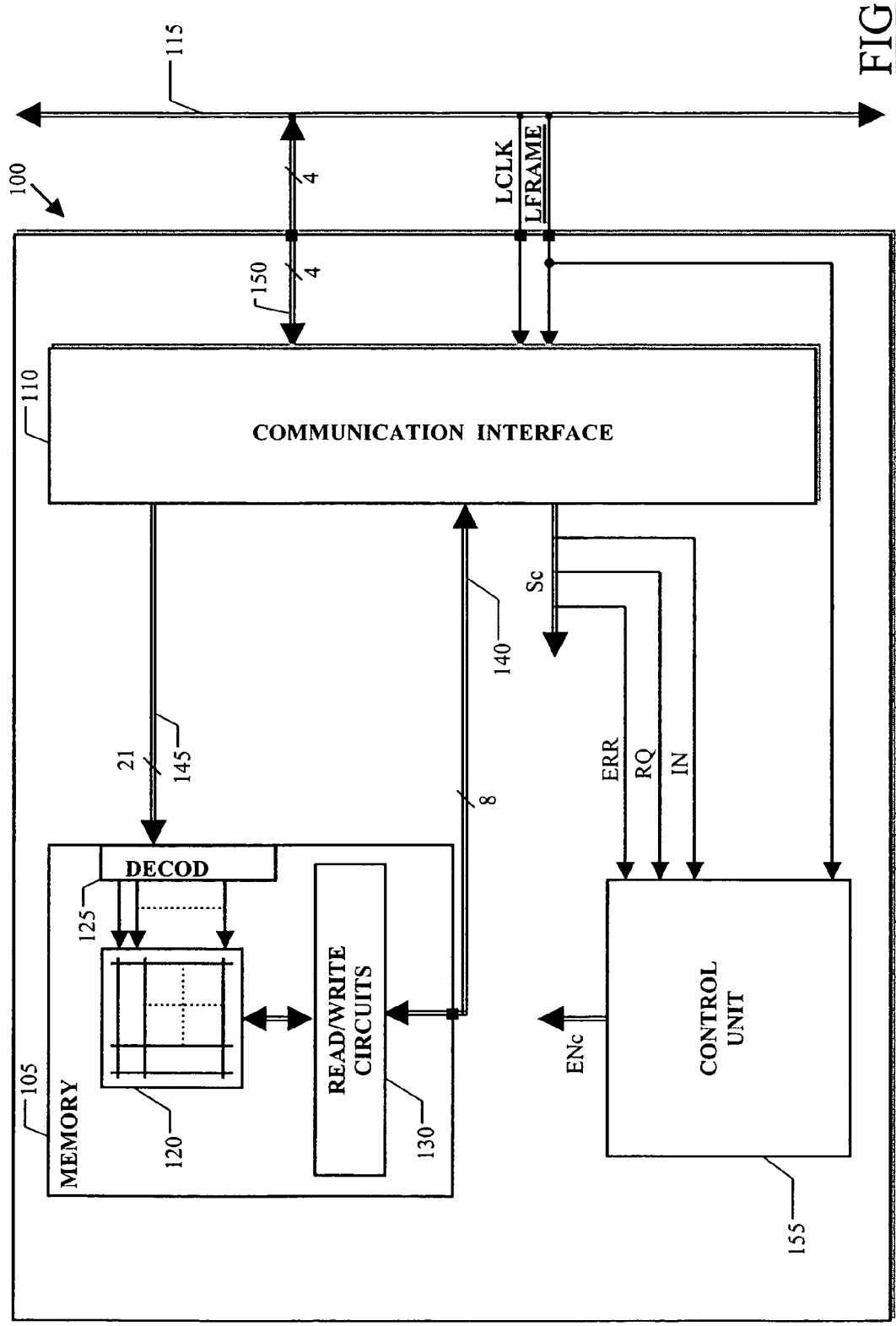
FIG. 1 shows a functional block diagram of an integrated device, including a synchronous non-volatile memory, according to an embodiment of the present invention.

With reference particularly to FIG. 1, a functional block diagram is shown of an integrated device 100 according to an embodiment of the present invention. The integrated device 100 includes (preferably in a same chip of semiconductor material) a semiconductor memory 105 and a communication interface 110 adapted to interface the memory 105 with external devices (not shown in the figure) through a suitable external communication bus 115. Such external devices, for example, can include a microprocessor, a microcontroller, a digital signal processor (DSP) and similar.

The memory 105 is of the non-volatile type, particularly but not limitatively a flash EEPROM memory. The memory 105 includes a matrix 120 of memory cells (for example, made with floating gate MOS transistors). The memory 105 manages groups of bits in parallel, which define a word stored in a corresponding memory location. The memory locations are selectively accessed, for reading or for writing, by providing a corresponding address to the memory 105.

The data parallelism of the memory 105 depends on the number of bits stored in every memory location (i.e., on the length of each word); typically, the memory 105 has a data parallelism equal to a byte (8 bits). Instead, the addressing parallelism depends on the size of the memory 105. Let us suppose, for example, that the memory 105 has a size of 16 Mbits; in this case, the memory 105 must receive an address of 21 bits for selecting a location storing a byte.

Decoding and selection circuits 125 can be used to decode the address provided to the memory 105, so as to select a corresponding location of the memory 105 univocally. The memory 105 further includes read/write circuits 130. For example, the read/write circuits 130 include a set of sense amplifiers and a set of program loads. The read/write circuits 130 further include circuits for the generation of voltages and currents necessary for performing operations on the memory 105. Typically, such circuits include charge pumps for the generation of suitable boosted voltages and reference current generators.

The memory 105 is provided with input/output terminals for receiving/transmitting information from/to the outside (i.e., words read from or to be written on the memory 105). The input/output terminals of the memory 105 (in this example 8) are connected to a data bus 140 of the communication interface 110 consisting of 8 signal lines.

Instead, the address is provided to the decoding and selection circuits 125 of the memory 105 through an address bus 145 composed of 21 signal lines.

The external bus 115 is a bus with reduced number of signal lines. In particular, the external bus 115 conforms to the LPC standard and includes 4 signal lines LAD[0], LAD[1], LAD[2], LAD[3] used in multiplexed time-division way for transferring information serially at blocks of 4 bits at a time from/to the memory 105. Moreover, the external bus 115 includes a signal line LCLK, used for transferring a clock signal adapted to synchronize the operations of the various devices connected to the external bus 115, and a signal line LFRAME, used for transferring a start signal of a communication transaction between two devices connected to the external bus 115. The signal LFRAME is underlined to indicate that it is asserted at a low logical value 0 and de-asserted at a high logical value 1. Additionally, the communication interface 110 is connected to other signal lines of the external bus 115 contemplated by the LPC standard, such as, for example, supply and reference lines. Each signal line of the external bus 115 is connected to a respective pin of a package of the integrated device 100.

The communication interface 110 includes a communication bus 150 connected to the signal lines LAD[0], LAD[1], LAD[2], LAD[3] of the external bus 115 thanks to pads each connected to a respective pin of the integrated device 100.

The communication interface 110 receives an address from the communication bus 150 at blocks of 4 bits at a time. In the example at issue, the communication interface 110 receives an address of 32 bits provided by the external bus 115. The address is stored into the communication interface 110 and its 21 less significant bits are used for selecting a memory location 105. When the address has been received in full, the 21 less significant bits are provided to the decoding and selection circuits 125 of the memory 105 in parallel, i.e., all in a single clock period through the address bus 145.

The communication interface 110 can also store a plurality of words, for example, 256. The communication interface 110 receives/transmits blocks of 8 bits (i.e., a word) at a time, according to the data parallelism of the memory 105, through the data bus 140 and receives/transmits blocks of 4 bits at a time, according to the transfer parallelism of the external bus 115, through the communication bus 150.

In response to codes provided by the external bus 115 the communication interface 110 asserts a plurality of corresponding control signals, as a whole indicated with Sc, for enabling and for timing the blocks of the integrated device 100 properly during an operation on the memory 105.

The integrated device 100 further includes a control unit 155 for activating the voltage and current generation circuits included in the read/write circuits 130 of the memory 105.

In particular, the control unit 155 receives control signals RQ, ERR and IN (described in detail in the following) from the communication interface 110 and the signal LFRAME from the external bus 115. The control unit 155 provides a plurality of enabling signals, as a whole indicated with ENc, each for activating/deactivating a respective voltage or current generation circuit in synchronous way.

In detail, the integrated device 100 provides the possibility to pass automatically from an activity phase, wherein the voltage and current generation circuits of the read/write circuits 130 are used (with a relatively high power consumption) to a stand-by phase, wherein such circuits are switched off for reducing the power consumption.

For example, during a reading operation on the memory 105, an operation charge pump is switched on for providing a suitable boosted voltage for the reading. Moreover, a current generator is also switched on for providing an internal reference current. The operation charge pump and the reference current generator are typically at high power consumption and therefore they are normally switched off during the stand-by phase.

For reducing a charge time of the operation charge pump, during the stand-by phase it is possible to provide the use of a stand-by charge pump with reduced power consumption, included in the read/write circuits 130 for precharging a circuit node of the operation charge pump. In the switching from the stand-by phase to the activity phase the stand-by charge pump is turned off.

In any case, the concepts of the present invention can also be applied when each memory cell stores more than a single bit and when the data and/or address parallelism of the memory is different. Alternatively, also the transfer parallelism of the external bus can be different. Moreover, the stand-by charge pump might not be provided or it might be used otherwise.

In the following, the working of the integrated device 100 will be described considering, by way of example, a reading operation on the memory 105.

Figure 2:
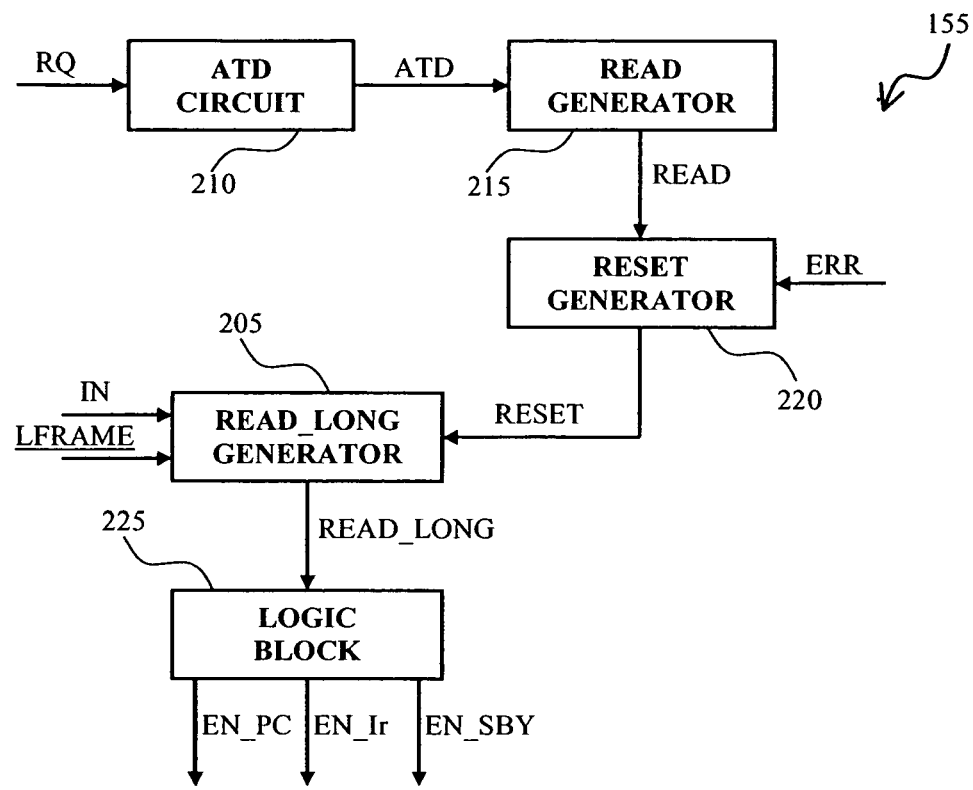
FIG. 2 is a functional block diagram of a control unit included in the integrated device of FIG. 1, in particular including generators of an activation signal and of a deactivation signal used during a reading operation on the synchronous memory.

Referring to FIG. 2, a schematic block diagram of an embodiment of the control unit 155 included in the integrated device according to the present invention is shown. Particularly, in FIG. 2 there are shown functional blocks useful for a reading operation.

The control unit 155 includes a generator 205 of an activation signal READ_LONG; the generator 205 receives the control signal IN from the communication interface and the signal LFRAME from the external bus. The control signal IN is indicative of the fact that the communication interface has received a request of operation from the external bus and therefore the memory must enter into the activity phase (from now on it will be indicated as start signal IN).

The activation signal READ_LONG, provided by the generator 205 in response to the signals IN and LFRAME, is maintained asserted for a time period in which the voltage and current generation circuits of the read/write circuits must be maintained activated.

The control unit 155 also includes an ATD circuit 210, which receives the control signal RQ provided by the communication interface, indicative of the fact that an address has been received in full. Therefore, the control signal RQ is indicative of the fact that the communication interface has received the information from the external bus that is necessary for the execution of the requested operation (for example, a reading operation) and from now on it will be indicated as requesting signal. In response to the requesting signal RQ the ATD circuit 205 provides a pulse ATD of some nanoseconds.

Furthermore, the control unit 155 includes a generator 215 of a reading signal READ, which receives the pulse ATD. In response to the reception of the pulse ATD, the reading signal READ is maintained asserted by the corresponding generator 215 for a time period (known a priori) necessary for the completion of an operation of reading of a word from the memory.

Additionally, the control unit 155 includes a generator 220 of a deactivation signal RESET, that receives the control signal ERR from the communication interface and the reading signal READ. The control signal ERR is indicative of the fact that the communication interface has detected an error in one of the codes received through the external bus (from now on it will be indicated as error signal). The generator 205 of the activation signal READ_LONG then receives the deactivation signal RESET indicative of the fact that the activity phase of the memory 105 must be terminated.

The control unit 155 further includes a logical block 225, which receives the activation signal READ_LONG and in response thereto provides the plurality of enabling signals. In particular, the logical block 225 provides enabling signals EN_SBY, EN_PC and EN_Ir for controlling the activation of the stand-by charge pump, of the operation charge pump and of the reference current generator, respectively.

A reading operation supported by the integrated device 100 and the working of the control unit 155 will now be described with reference to FIG. 3, considered in conjunction with FIGS. 1-2.

Figure 3:
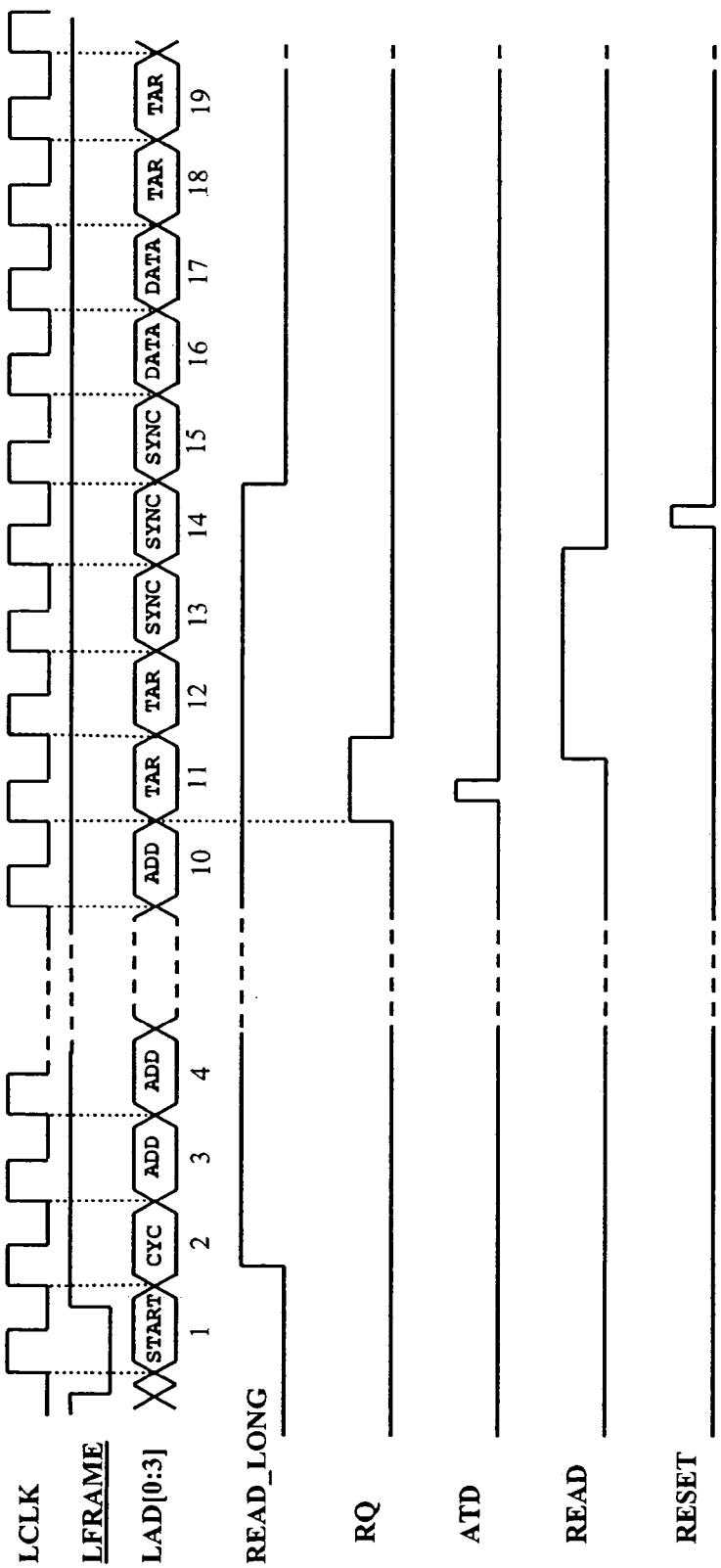
FIG. 3 shows in schematic form the timing of a reading operation on the synchronous memory and of signals produced by the integrated device in a synchronous manner during the reading operation.

FIG. 3 shows, in schematic and simplified way, the timing of a reading operation of a word from the memory 105 and of the signals ATD, RQ, READ and READ_LONG generated in a synchronous way during the reading operation.

Each operation to be performed on the memory 105 requires at least one communication cycle between the integrated device 100 and an external device, for example, a microprocessor. Each communication cycle is timed by a number of clock periods depending on the type of operation and on the size of the information to be transmitted or to be received (addresses, data or command codes). In turn each cycle is divided in different steps, corresponding to respective fields, provided by a communication protocol tied to the standard of the external bus 115 and necessary for the execution of the operation on the memory 105.

For starting an operation on the integrated device 100 the external microprocessor asserts the signal LFRAME. This event is detected by the communication interface 110 that then waits for receiving, in correspondence of a clock period 1, the start code of 4 bits, for example, equal to 0001, from the lines LAD[0], LAD[1], LAD[2] and LAD[3] of the external bus 115 (field START).

If the communication interface 110 decodes the start code, it asserts the control signal IN provided to the generator 205 of the activation signal READ_LONG.

The generator 205 asserts the activation signal READ_LONG if, further to receiving the signal LFRAME asserted, also receives the start signal IN asserted.

In response to the activation signal READ_LONG asserted, the logical block 225 de-asserts the enabling signal EN_SBY that deactivates the stand-by charge pump. At the same time, the logical block 225 asserts the enabling signals EN_Ir and EN_PC that activate the reference current generator and the operation charge pump. In this way, the integrated device 100 exits the stand-by phase and it enters the activity phase.

The communication interface 110 then waits for receiving, in correspondence of the clock period 2 one of a plurality of command codes of 4 bits from the lines LAD[0], LAD[1], LAD[2] and LAD[3] of the external bus 115 (field CYC). Each command code is indicative of the type of operation that must be performed and, therefore, of the type of communication cycle.

Supposing that the communication interface 110 recognizes a reading command code of a word (for example, equal to 0100), it provides the control signals Sc necessary to perform the reading operation to the blocks and to the pins of the integrated device 100.

Beginning from the clock period 3, the communication interface 110 receives an address of the memory 105 (field ADD) provided by the lines LAD[0], LAD[1], LAD[2] and LAD[3] of the external bus 115 4 bits at a time through the communication bus 150. This means that at the clock period 3 the first 4 bits of the address are received and stored, at the clock period 4 the next 4 bits will be received and stored and so on up to have the whole 32 bits of the address stored. Therefore, the reception of the address of 32 bits requires 8 clock periods (from the period 3 to the period 10).

At the clock period 11, the address is transmitted in parallel through the address bus 145 to the decoding and selection circuits 125 of the memory 105, which select the corresponding memory location to be read.

At the same time, the communication interface 110 asserts the requesting signal RQ, indicating that the address has been received in full, and in response thereto the circuit ATD 205 provides the pulse ATD.

In response to the pulse ATD the generator 215 asserts the reading signal READ, that is maintained asserted for a time about two clock periods, i.e., the time required by the sense amplifiers to complete a reading operation on the memory 105.

Meanwhile, at the clock period 11 the external microprocessor provides an inversion code, for example, equal to 1111, through the lines LAD[0], LAD[1], LAD[2] and LAD[3] of the external bus 115 (field TAR), to indicate an inversion of the direction of communication. The inversion code is decoded by the communication interface 110. In response thereto, at the clock period 12 the communication interface 110 sets the pins of the integrated device 100 connected to the lines LAD[0], LAD[1], LAD[2] and LAD[3] of the external bus 115 at high impedance (floating state), so as to allow the communication interface 110 to take the control of the external bus 115 without interference problems.

Beginning from the clock period 13 a synchronization phase starts (field SYNC). In particular, the communication interface 110 transmits a synchronization code, for example, equal to 0101, to the external microprocessor through the lines LAD[0], LAD[1], LAD[2] and LAD[3] of the external bus 115. The synchronization code is transmitted for 2 clock periods (the periods 13 and 14), so that the reading operation on the memory 105 can be completed. At the clock period 15 the communication interface 110 transmits an availability code (for example, equal to 0000), indicative of the fact that the reading operation on the memory 105 is terminated and the read word is available from the next clock period.

On the falling edge of the reading signal READ the generator 220 provides the deactivation pulse RESET to the generator 205 that in response thereto de-asserts the activation signal READ_LONG.

In response to the activation signal READ_LONG de-asserted, the logical block 225 de-asserts the enabling signals EN_V and EN_Ir for deactivating the reference current generator and the operation charge pump; instead, the enabling signal EN_SBY is asserted for activating the stand-by charge pump. In this way, the memory 105 is brought back to the stand-by phase.

Beginning from the clock period 16 the communication interface 110 transmits the read word through the communication bus 150 toward the lines LAD[0], LAD[1], LAD[2] and LAD[3] of the external bus 115 at blocks of 4 bits at a time (field DATA); for this purpose 2 clock periods are necessary (the periods 16 and 17).

After the transmission of the read word, in order to conclude the communication cycle between the integrated device 100 and the external microprocessor other 2 clock periods are required (the period 18 and the period 19) for a further inversion of the communication (field TAR). In particular, at the clock period 18 the communication interface 110 transmits the inversion code 1111 to the external microprocessor through the bus 150 and at the clock period 19 sets the pins of the integrated device 100 to the high impedance condition. The external microprocessor, after having received the inversion code, takes back the control of the external bus 115.

Returning to the beginning of the operation, in the case in which the communication interface 110 does not decode the correct start code at the clock period 1 or a correct command code at the clock period 2, the error signal ERR is asserted. In response to the error signal ERR asserted the generator 220 provides the deactivation signal RESET so as to bring the integrated device 100 to the stand-by phase immediately without uselessly consuming power.

Instead considering a reading operation of a plurality of words, for example, a sequential reading, the communication interface 110 in any case receives a single address according to the protocol LPC. For reading the required words, the address is updated by the communication interface 110 internally. At each variation of the address the requesting signal RQ is again asserted (before the reading signal READ is de-asserted). Consequently, the reading signal READ is iterated so as to maintain asserted the activation signal READ_LONG; in such a way, the operation charge pump and the reference current generator are maintained on for the total length of the operation.

In the above-described structure, wherein the operations must be synchronized with the clock signal, the start time of an operation is predictable. Additionally, for performing any operation on the memory there is required a corresponding communication cycle and, therefore, an initial time between the request of operation and the start of the same operation wherein corresponding data and addresses must be loaded. In particular, considering an integrated device implemented according to a protocol that provides a lower external transfer parallelism than an internal transfer parallelism (as for example, the protocol LPC), such initial loading time is equal to some clock periods (in detail, nine clock periods). The initial loading time is exploited for activating, in a synchronous way, the charge pump and the current generator of interest at the start of each communication cycle so that they are in a working condition when an operation on the memory starts.

Consequently, the charge pump and the current generator can be deactivated immediately after the completion of the reading operation with a substantial power saving in comparison to synchronous memory devices known in the art. In particular, referring to the memory devices conforming to the standard LPC, the stand-by phase of the memory can already start at the clock period wherein the external bus begins receiving the read word (or the read words).

Figure 4:
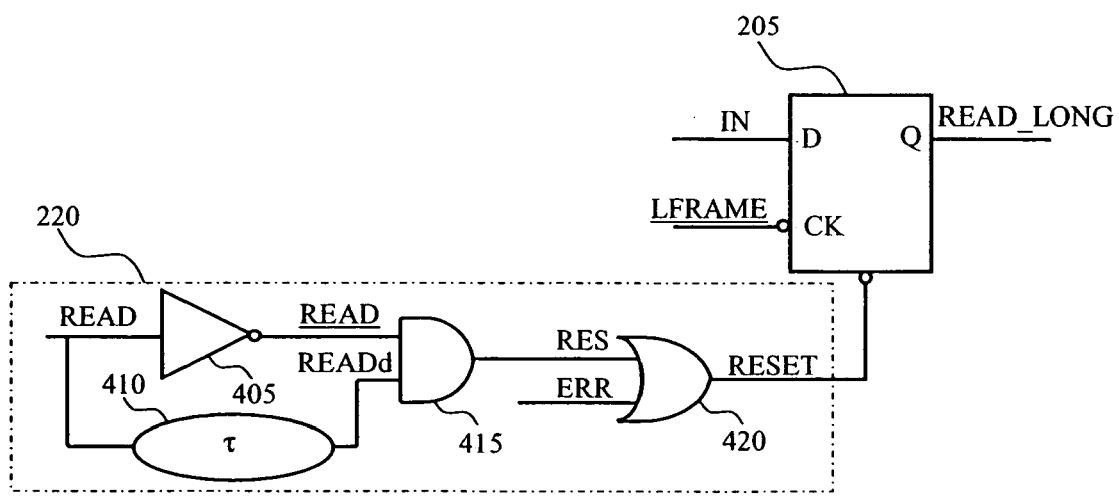
FIG. 4 is a schematic showing an embodiment of generators of the activation and deactivation signals used for the reading operation.

Considering now FIG. 4, an embodiment of the generators 205 and 220 of the activation signal READ_LONG and deactivation signal RESET used during a reading operation is illustrated schematically.

The generator 220 of the deactivation signal RESET includes a logical NOT gate 405 for negating the reading signal READ and a delay circuit 410 for delaying the same reading signal READ of a period $\tau$ (for example, of some nanoseconds).

The generator 220 also includes a logical AND gate 415, which receives the negated reading signal $\overline{READ}$ and the delayed reading signal, indicated with READd. Such logical AND gate 415 provides a logical signal RES.

The generator 220 of the deactivation signal RESET further includes a logical OR gate 420 that receives the logical signal RES at a first input and the error signal ERR at a second input. The logical OR gate 420 provides the deactivation signal RESET.

The generator 205 of the activation signal READ_LONG consists of a latch, such as, for example, a flip-flop of the D type. The flip-flop 205 receives the start signal IN at a data input D. A clock input CK of the flip-flop 205 receives the inverted signal LFRAME. The flip-flop 205 also receives the deactivation signal RESET at a reset input and provides the activation signal READ_LONG at an output Q.

At the start of the communication cycle the reading signal READ is de-asserted. Consequently, the negated reading signal $\overline{READ}$ is at a high logical value and the delayed reading signal READd is at a low logical value. Therefore, the logical AND gate 405 provides a logical signal RES at the low logical value. Moreover, the error signal ERR is also de-asserted and the logical OR gate 420 accordingly provides the deactivation signal RESET de-asserted.

When the signal LFRAME is asserted at the start of the communication cycle, the flip-flop 205 latches the logical value corresponding to the start signal IN. If the start signal IN is asserted, the flip-flop 205 latches the high logical value and the activation signal READ_LONG is then asserted. If the start signal IN remains de-asserted, the activation signal READ_LONG accordingly remains de-asserted.

Beginning from the raising edge of the reading signal READ, the negated reading signal $\overline{READ}$ is maintained at a low logical value for the time in which the reading signal READ is maintained asserted. Consequently, the delayed reading signal READd and the negated reading signal $\overline{READ}$ are both at the high logical value for a period $\tau$ beginning from the raising edge of the negated reading signal $\overline{READ}$. Thus, the logical AND gate 415 provides the logical signal RES asserted starting from the raising edge of the negated reading signal $\overline{READ}$ (i.e., the falling edge of the reading signal READ) for the period $\tau$.

In the case in which the error signal ERR remains de-asserted for the whole communication cycle, the logical OR gate 420 provides the deactivation signal RESET corresponding to the logical signal RES. Thus, in correspondence of the period $\tau$ wherein the deactivation signal RESET is asserted, the flip-flop 205 is reset and the activation signal READ_LONG is de-asserted.

Instead, in the case in which the error signal ERR is asserted, the logical OR gate 420 provides the deactivation signal RESET corresponding to the error signal ERR. Thus, the flip-flop 205 is reset and the activation signal READ_LONG de-asserted, as soon as the error signal ERR is asserted.

Although the present invention has been described with a certain degree of particularity with reference to a preferred embodiment, variations are however possible in the implementation details.

For example, the integrated device could entail the deactivation of circuits and devices that are different from boosting voltage circuits and from current generators. Alternatively, the reading signal can be generated in a different way without the use of an ATD circuit. Additionally, the generator of the activation signal can be implemented in a different way other than using a flip-flop and the de-assertion of the activation signal can be implemented in a different way other than using the deactivation signal. The activation signal may be not de-asserted in case of decoding of errors in the command codes and it can be asserted without waiting for the decoding of the start code. However, the integrated device can be implemented according to a communication protocol different from the protocol LPC, which, for example, provides a different data transfer parallelism (for example, replacing the signal LFRAME with a chip enable, and the signals LAD[0], . . . , LAD[3] with generic input signals).

In alternative, the deactivation of the circuit means can be controlled in an active way if a completion operation signal is available.

Moreover, in the case of the multiple reading it is possible to provide an activation signal with a preset length (if the length of the operation of multiple reading is known a priori).

In any case, the concepts of the present invention are also applicable to other operations (for example, writing operations).

Naturally, in order to satisfy local and specific requirements, a person skilled in the art may apply to the solution described above many modifications and alterations all of which, however, are included within the scope of protection of the invention as defined by the following claims.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

The invention claimed is:

1. A synchronous non-volatile memory device, including:
   a non-volatile memory;
   circuit means for performing operations on the memory, the circuit means comprising a power circuit that comprises voltage boosting circuit blocks or current generators that operate in a stand-by condition at a first level of power consumption and in an active condition at a second level of power consumption that is higher than the first level of power consumption;
   means for receiving and processing a request of operation and operative information required for performing the operation in temporal succession, the request of operation received when the power circuit is in the stand-by condition;
   wherein the means for receiving includes a communication interface for interfacing the memory device with an external bus, the external bus having a data transfer parallelism lower than an internal data transfer parallelism of the memory device
   activation means for activating the circuit means, including the power circuit, in response to the request of operation, the activation means activating the circuit means from the stand-by condition to the active condition while the receiving means is processing the request of operation and operative information;
   means for enabling the execution of the operation in response to the operative information, and
   deactivation means for automatically deactivating the circuit means, including the power circuit, to the stand-by condition in response to the completion of the operation.

2. The synchronous non-volatile memory device according to claim 1 wherein the deactivation means includes means for deactivating the circuit means with a pre-set delay from the activation of the execution of an operation, the pre-set delay corresponding to a duration of the operation.

3. The synchronous non-volatile memory device according to claim 1 wherein the operative information comprises a corresponding address.

4. The synchronous non-volatile memory device according to claim 2 wherein the means for deactivating includes means for asserting a control signal for the pre-set delay in response to the reception of the reading address, the circuit means being deactivated in response to the de-assertion of the control signal.

5. The synchronous non-volatile memory device according to claim 4 wherein the reading operation is a multiple reading operation and wherein the memory device further includes means for updating the reading address in succession, the control signal being asserted for the pre-set delay in response to each update of the reading address before the de-assertion resulting from a preceding reading address.

6. The synchronous non-volatile memory device according to claim 1 wherein the request of operation includes a start code, and wherein the means for receiving includes means for decoding the start code, the activation means activating the circuit means in response to the decoding of the start code.

7. The synchronous non-volatile memory device according to claim 1 wherein the means for receiving includes means for detecting an error in the request of operation or in the operative information, the deactivation means deactivating the circuit means in response to the detection of the error.

8. The synchronous non-volatile memory device according to claim 1, further including means for latching a command signal for activating the circuit means, the command signal being asserted by the activation means and being de-asserted by the deactivation means.

9. A working method of a synchronous non-volatile memory device that includes a circuit for performing operations on the memory device that has a power circuit which includes voltage boosting circuits or current generation circuits that operate in a stand-by condition at a first power level and in an active condition at a second power level higher than the first power level, the method including the steps of:
   receiving a request of operation and operative information required for performing the operation in temporal succession and processing the request of operation and operative information, the request of operation received when the power circuit is in the stand-by condition;
   wherein receiving a request of operation and operative information comprises receiving the request of operation and operative information at a communication interface that interfaces the memory device with an external bus, and wherein the bus has a data transfer parallelism lower than an internal data transfer parallelism of the memory device
   activating the circuit from the stand-by condition including the power circuit, to the active condition, for performing operations in response to the request of operation and during a time the request of operation and operative information is being processed;
   enabling the execution of the operation in response to the operative information; and
   automatically deactivating the circuit for performing operations and the power circuit to the stand-by condition in response to the completion of the operation.

10. The method of claim 9 wherein deactivating the circuit for performing operations comprises deactivating the circuit for performing operations with a pre-set delay from the step of activating the circuit for performing operations.

11. The method of claim 10 wherein the deactivating of the circuit for performing operations comprises configuring the preset delay to correspond to a duration of the operation to be completed.

12. The circuit of claim 11 wherein the deactivating circuit is configured to deactivate the operation performing circuit with a pre-set delay from activation of the operation performing circuit.

13. The circuit of claim 12 wherein the preset delay is configured to correspond to a duration of the operation to be performed by the operation performing circuit.

14. A circuit, comprising:
a non-volatile memory;
a circuit for performing operations on the memory in response to a request for operation, the circuit for performing operations comprising a power circuit that includes at least one of a voltage boosting circuit and a current generating circuit;
a circuit for processing a request of operation and operative information, the request of operation received when the power circuit is in a stand-by condition;
wherein the circuit for processing includes a communication interface for interfacing the memory with an external bus, the external bus having a data transfer parallelism lower than an internal data transfer parallelism of the memory device
an activation circuit for activating the power circuit and the operations performing circuit from the stand-by condition in response to a request for operation and during a time the processing circuit is processing the operative information;
a circuit for enabling execution of the operation in response to receipt of processed operative information; and
a circuit for automatically deactivating the operations performance circuit and the power circuit to the stand-by condition in response to completion of the operation.

15. The circuit of claim 14 wherein the circuit for performing operations is configured to perform at least one from among a read operation and a write operation on the non-volatile memory.

16. The circuit of claim 14 wherein the circuit for processing a request of operation and operative information is configured to detect an error in the request of operation or in the operative information and to initiate deactivation of the circuit for performing operations in response to the detection of the error.

17. The circuit of claim 16 wherein the processing circuit is configured to decode a start code in the request of operation and to transmit an activation signal to the activation circuit in response to decoding of the start code and prior to processing of the operative information.

18. A method of operating a memory device having a non-volatile memory, comprising:
receiving a request of operation with respect to the memory and processing the request to generate a control signal, the request of operation received when a power circuit and an operation circuit are in a stand-by condition;
wherein receiving a request of operation comprises receiving the request of operation at a communication interface that interfaces the memory device with an external bus and detects errors in signals received from the external bus, wherein the external bus is provided to have a data transfer parallelism lower than an internal data transfer parallelism of the memory device
activating the operation circuit, including the power circuit having at least one of a voltage boosting circuit and a current generator circuit, in response to the request of operation on the memory and during a time the request of operation is being processed;
processing operative information after the control signal is generated;
automatically placing the operation circuit and the power circuit in a stand-by phase either during a clock period wherein an external bus begins receiving a read word or upon completion of the requested operation with a preset delay that commences from activation of the operation circuit.

19. The method of claim 18 wherein the preset delay is set to correspond to a duration of the operation set forth in the request of operation.

20. The method of claim 18 wherein the request of operation can be one from among a read operation, a write operation, and a multiple read operation.

21. The method of claim 18 wherein activating an operation circuit to perform a requested operation comprises receiving operation information and enabling activation of the operation circuit in response to the operation information.

22. A synchronous non-volatile memory device, including:
circuit means for performing operations on the memory device;
means for receiving a request of operation and operative information required for performing the operation in temporal succession;
activation means for activating the circuit means in response to the request of operation;
means for enabling the execution of the operation in response to the operative information, and
deactivation means for deactivating the circuit means in response to the completion of the operation, the deactivation means comprising means for deactivating the circuit means with a pre-set delay from the activation of the execution of an operation, the pre-set delay corresponding to a duration of the operation, the deactivating means further including means for asserting a control signal for the pre-set delay in response to the reception of the reading address, and the circuit means being deactivated in response to a de-assertion of the control signal.

23. The synchronous non-volatile memory device according to claim 22 wherein the reading operation is a multiple reading operation and wherein the memory device further includes means for updating the reading address in succession, the control signal being asserted for the pre-set delay in response to each update of the reading address before the de-assertion resulting from a preceding reading address.

24. The synchronous non-volatile memory device according to claim 22 wherein the means for receiving includes a communication interface for interfacing the memory device with an external bus, the external bus having a data transfer parallelism lower than an internal data transfer parallelism of the memory device.

25. The synchronous non-volatile memory device according to claim 22 wherein the operation is a reading operation and wherein the operative information includes a reading address.

26. The synchronous non-volatile memory device according to claim 22 wherein the request of operation includes a start code, and wherein the means for receiving includes means for decoding the start code, the activation means activating the circuit means in response to the decoding of the start code.

27. The synchronous non-volatile memory device according to claim 22 wherein the means for receiving includes means for detecting an error in the request of operation or in the operative information, the deactivation means deactivating the circuit means in response to the detection of the error.

28. The synchronous non-volatile memory device according to claim 22, further including means for latching a command signal for activating the circuit means, the command signal being asserted by the activation means and being de-asserted by the deactivation means.

29. The synchronous non-volatile memory device according to claim 22 wherein the circuit means includes voltage boosting circuit blocks or generators for generating reference signals.

30. A synchronous non-volatile memory device, including:
   a non-volatile memory;
   circuit means for performing operations on the memory, the circuit means comprising a power circuit that comprises voltage boosting circuit blocks or current generators that operate in a stand-by condition at a first level of power consumption and in an active condition at a second level of power consumption that is higher than the first level of power consumption;
   means for receiving and processing a request of operation and operative information required for performing the operation in temporal succession;
   activation means for activating the circuit means in response to the request of operation, the activation means activating the circuit means to the active condition while the receiving means is processing the request of operation and operative information;
   means for enabling the execution of the operation in response to the operative information, and
   deactivation means for automatically deactivating the circuit means to the stand-by condition in response to the completion of the operation, the deactivation means is structured to deactivate the circuit means after information has been read from the memory and before the read information is provided outside the device.

31. A working method of a synchronous non-volatile memory device that includes a circuit for performing operations on the memory device that has a power circuit which includes voltage boosting circuits or current generation circuits that operate in a stand-by condition at a first power level and in an active condition at a second power level higher than the first power level, the method including the steps of:
   receiving a request of operation and operative information required for performing the operation in temporal succession and processing the request of operation and operative information;
   activating the circuit, including the power circuit to the active condition, for performing operations in response to the request of operation and during a time the request of operation and operative information is being processed;
   enabling the execution of the operation in response to the operative information; and
   automatically deactivating the circuit for performing operations to the stand-by condition in response to the completion of the operation, wherein deactivating the circuit comprises deactivating the power circuit after information has been read from the memory and before the read information is provided outside the device.

32. A method of operating a memory device having a non-volatile memory, comprising:
   receiving a request of operation with respect to the memory and processing the request to generate a control signal;
   activating an operation circuit, including a power circuit having at least one of a voltage boosting circuit and a current generator circuit, in response to the request of operation on the memory and during a time the request of operation is being processed;
   processing operative information after the control signal is generated;
   automatically placing the operation circuit in a stand-by phase either during a clock period wherein an external bus begins receiving a read word or upon completion of the requested operation with a preset delay that commences from activation of the operation circuit, wherein placing the operation circuit in the stand-by phase comprises deactivating the power circuit after information has been read from the memory and before the information is provided outside the device.

* * * * *